(12) United States Patent
Beste et al.

(10) Patent No.: US 9,310,089 B2
(45) Date of Patent: Apr. 12, 2016

(54) VARIABLE SPEED MOTOR CONTROL METHOD AND APPARATUS

(75) Inventors: Mark G. Beste, Grapevine, TX (US);
Brian Hudson, Carrollton, TX (US);
Roger C. Hundt, Carrollton, TX (US);
David Omlor, Flower Mound, TX (US);
Stephen A. Walter, Flower Mound, TX (US); David M. Wynnick, Lewisville, TX (US)

(73) Assignee: Lennox Industries Inc., Richardson, TX (US)

( * ) Notice: Subject to any disclaimer, the term of this patent is extended or adjusted under 35 U.S.C. 154(b) by 1043 days.

(21) Appl. No.: 12/694,395

(22) Filed: Jan. 27, 2010

(65) Prior Publication Data

US 2010/0298983 A1    Nov. 25, 2010

Related U.S. Application Data

(60) Provisional application No. 61/180,405, filed on May 21, 2009.

(51) Int. Cl.
*F24F 11/00* (2006.01)
*G01D 4/00* (2006.01)
(Continued)

(52) U.S. Cl.
CPC .............. *F24F 11/0009* (2013.01); *G01D 4/00* (2013.01); *G01R 21/00* (2013.01); *G01R 21/127* (2013.01); *G01R 21/133* (2013.01); *G01R 21/1335* (2013.01); *G05B 13/00* (2013.01); *G05B 13/02* (2013.01); *G05B 15/02* (2013.01); *G05B 19/042* (2013.01); *G05D 23/1393* (2013.01); *G06Q 50/06* (2013.01); *H01R 13/6456* (2013.01); *H01R 23/7073* (2013.01); *H02P 25/04* (2013.01); *G05B 2219/2614* (2013.01); *H02J 2003/143* (2013.01); *H02J 2003/146* (2013.01);

(Continued)

(58) Field of Classification Search
CPC ........ G01D 4/00; G01R 21/00; G01R 21/127; G01R 21/133; G01R 21/1335; G05B 13/00; G05B 13/02; G06Q 50/06; H02J 2003/143; H02J 2003/146; H02P 25/04; Y02B 70/3216; Y02B 70/3225; Y02B 70/3233; Y02B 70/3241; Y02B 70/3275; Y04S 20/221; Y04S 20/222; Y04S 20/224
USPC ......... 700/12, 20, 28, 32, 33, 276; 73/114.15, 73/862.08, 862.23; 318/400.07, 432, 433, 318/599, 727, 772, 811
See application file for complete search history.

(56) References Cited

U.S. PATENT DOCUMENTS 5,492,273 A * 2/1996 Shah ........................... 236/44 A
8,718,825 B2 * 5/2014 George ........................ 700/276

(Continued)

OTHER PUBLICATIONS

Thaler, George J. Automatic Control Systems. St. Paul, Minn: West Publishing Company. 1989.*

*Primary Examiner* — Carlos Ortiz Rodriguez
*Assistant Examiner* — Jennifer L Norton
(74) *Attorney, Agent, or Firm* — Baker Botts L.L.P.

(57) ABSTRACT

An HVAC unit includes an HVAC motor and a system controller. The HVAC motor is coupled to a motor controller. The motor controller is configured to receive a command signal bearing a digitally encoded operating level of the HVAC motor. The system controller is coupled to the motor controller, and is configured to transmit the command signal to the motor controller. The system controller modulates the command signal with the digitally encoded operating level in response to a service demand.

14 Claims, 6 Drawing Sheets

(51) Int. Cl.
| | |
|---|---|
| *G01R 21/00* | (2006.01) |
| *G01R 21/127* | (2006.01) |
| *G01R 21/133* | (2006.01) |
| *G05B 13/00* | (2006.01) |
| *G05B 13/02* | (2006.01) |
| *G05B 15/02* | (2006.01) |
| *G05B 19/042* | (2006.01) |
| *G05D 23/13* | (2006.01) |
| *G06Q 50/06* | (2012.01) |
| *H01R 12/50* | (2011.01) |
| *H01R 13/645* | (2006.01) |
| *H02J 3/14* | (2006.01) |
| *H02P 25/04* | (2006.01) |

(52) U.S. Cl.
CPC .......... *Y02B 70/3216* (2013.01); *Y02B 70/3225* (2013.01); *Y02B 70/3233* (2013.01); *Y02B 70/3241* (2013.01); *Y02B 70/3275* (2013.01); *Y04S 20/221* (2013.01); *Y04S 20/222* (2013.01); *Y04S 20/224* (2013.01); *Y10T 29/49* (2015.01); *Y10T 29/4935* (2015.01); *Y10T 29/49117* (2015.01); *Y10T 29/49147* (2015.01); *Y10T 29/49359* (2015.01); *Y10T 29/49826* (2015.01); *Y10T 307/713* (2015.04)

(56) References Cited

U.S. PATENT DOCUMENTS

| | | | | |
|---|---|---|---|---|
| 8,738,185 | B2* | 5/2014 | Puranen et al. | 700/276 |
| 8,755,942 | B2* | 6/2014 | Bonilla et al. | 700/276 |
| 2003/0030408 | A1* | 2/2003 | Ratz et al. | 318/772 |
| 2003/0057899 | A1* | 3/2003 | LaCroix | 318/114 |
| 2006/0265890 | A1* | 11/2006 | Solan et al. | 33/320 |
| 2007/0248467 | A1* | 10/2007 | Shahi et al. | 417/1 |
| 2008/0011864 | A1* | 1/2008 | Tessier et al. | 236/51 |
| 2009/0055026 | A1* | 2/2009 | Ha et al. | 700/274 |
| 2010/0068070 | A1* | 3/2010 | Shahi et al. | 417/1 |
| 2010/0146712 | A1* | 6/2010 | Finch et al. | 8/137 |
| 2012/0209435 | A1* | 8/2012 | Harayama | 700/276 |
| 2014/0114441 | A1* | 4/2014 | Kawai et al. | 700/22 |
| 2014/0148954 | A1* | 5/2014 | Huang | 700/276 |

* cited by examiner

VARIABLE SPEED MOTOR CONTROL METHOD AND APPARATUS

CROSS-REFERENCE TO RELATED APPLICATION

This application claims the benefit of U.S. Provisional Application Ser. No. 61/180,405, filed by Beste, et al., on May 21, 2009, entitled "Comprehensive HVAC Control System," commonly assigned with this application and incorporated herein by reference.

TECHNICAL FIELD

This application is directed, in general, to a heating, ventilation and air conditioning (HVAC) and, more specifically, to control of HVAC systems.

BACKGROUND

HVAC systems provide environmental conditioning of indoor spaces, including heating, cooling, humidification and dehumidification. The industry is crowded with manufacturers, leading to intense competition and product differentiation based on features and cost. Competition results in reduced margins for manufacturers, and continuous efforts to reduce costs.

SUMMARY

One embodiment has described herein provides an HVAC unit having an HVAC motor and a system controller. The HVAC motor is coupled to a motor controller. The motor controller is configured to receive a command signal bearing a digitally encoded operating level of the HVAC motor. The system controller is coupled to, the motor controller, and is configured to transmit the command signal to the motor controller. The system controller modulates the command signal with the digitally encoded operating level in response to a service demand.

Another aspect provides a method of manufacturing an HVAC system. The method includes configuring a system controller to transmit a command signal bearing a digitally encoded operating level of an HVAC motor in response to a service demand. The method further includes coupling an HVAC motor controller to the command signal. The HVAC motor controller is configured to decode the operating level from the command signal, and to control an operation of an HVAC motor in response to the operating level.

Yet another aspect provides an HVAC system controller that includes a memory and a microcontroller. The memory is configured to store program instructions. The microcontroller is configured to read the instructions. In response to the instructions, the microcontroller encodes an operating level on a digital control signal in response to a service demand. A signal driver is configured to transmit the digital control signal to an HVAC motor controller.

In another aspect, an HVAC system is provided. The HVAC system includes a multispeed HVAC motor and a variable capacity HVAC compressor. The HVAC motor has a first winding configured to produce a first number of magnetic poles when energized, and has a second winding configured to produce a second number of magnetic poles when energized. The HVAC motor is configured to provide a number, at least 2, of blower capacities in response to control signals supplied by an HVAC system controller. The variable capacity compressor is configured to compress a refrigerant with a number of compression capacities equal to the number of blower capacities.

In yet another aspect a method of manufacturing an HVAC system is provided. The method includes configuring a multispeed HVAC motor to provide a number, at least 2, of blower capacities in response to control signals supplied by an HVAC system controller. The HVAC motor has a first winding configured to produce a first number of poles when energized, and has a second winding configured to produce a second number of poles when energized. The method also includes configuring a variable capacity compressor to compress a refrigerant with at least two compression capacities equal to the number of blower capacities.

BRIEF DESCRIPTION

Reference is now made to the following descriptions taken in conjunction with the accompanying drawings, in which.

DETAILED DESCRIPTION

The present disclosure benefits from the unique recognition that various motors associated with HVAC functions such as refrigerant compression and air movement may be controlled using digital pulse modulation techniques. The motors may incorporate low-cost electronics to convert a received modulated digital signal to a motor operating level. The technique results in significant reduction of manufacturing and maintenance costs, and enables precision control of motor operation required for efficient, energy saving operation.

Conventional HVAC motor controls typically employ frequency conversion to provide variable motor output. A motor typically has a rated torque associated with operation at normal line voltage, e.g., 60 cycles per second (cps), three-phase, 208 VAC. Such conventional HVAC motor control reduces the output of the HVAC motor by reducing the frequency of the power delivered to the motor. Thus, e.g., an HVAC motor may be controlled to provide 50% of a maximum rated torque thereof by providing to it power at 30 cps.

However, frequency conversion suffers from significant deficiencies. The necessary electronics are expensive, and must typically be purchased from a third party by the HVAC manufacturer, adding significant cost to the HVAC system.

Moreover, the frequency conversion hardware has a significant inherent risk of failure, in part due to the high voltages being controlled thereby, thus reducing system reliability. Furthermore, frequency conversion is inherently less flexible, in that tailoring the control transfer function, e.g., to correct for nonlinearities, is difficult, and retrofitting of electronics to accommodate design changes is expensive.

Digital control techniques offer a low-cost, flexible alternative to line frequency conversion in HVAC motor control. However, HVAC manufacturers have failed to recognize this potential benefit. None of Trane, Carrier, York, Aaon or other residential or commercial HVAC manufacturer is known to have recognized the benefits provided by the various embodiments provided herein. These benefits include reduced manufacturing costs and greater precision of HVAC motor control. In an industry characterized by active competition, reduced manufacturing cost is expected to provide significantly greater flexibility in balancing HVAC system profit and market price, and greater precision of HVAC motor control can provide savings in energy costs to the end user.

Figure 1:
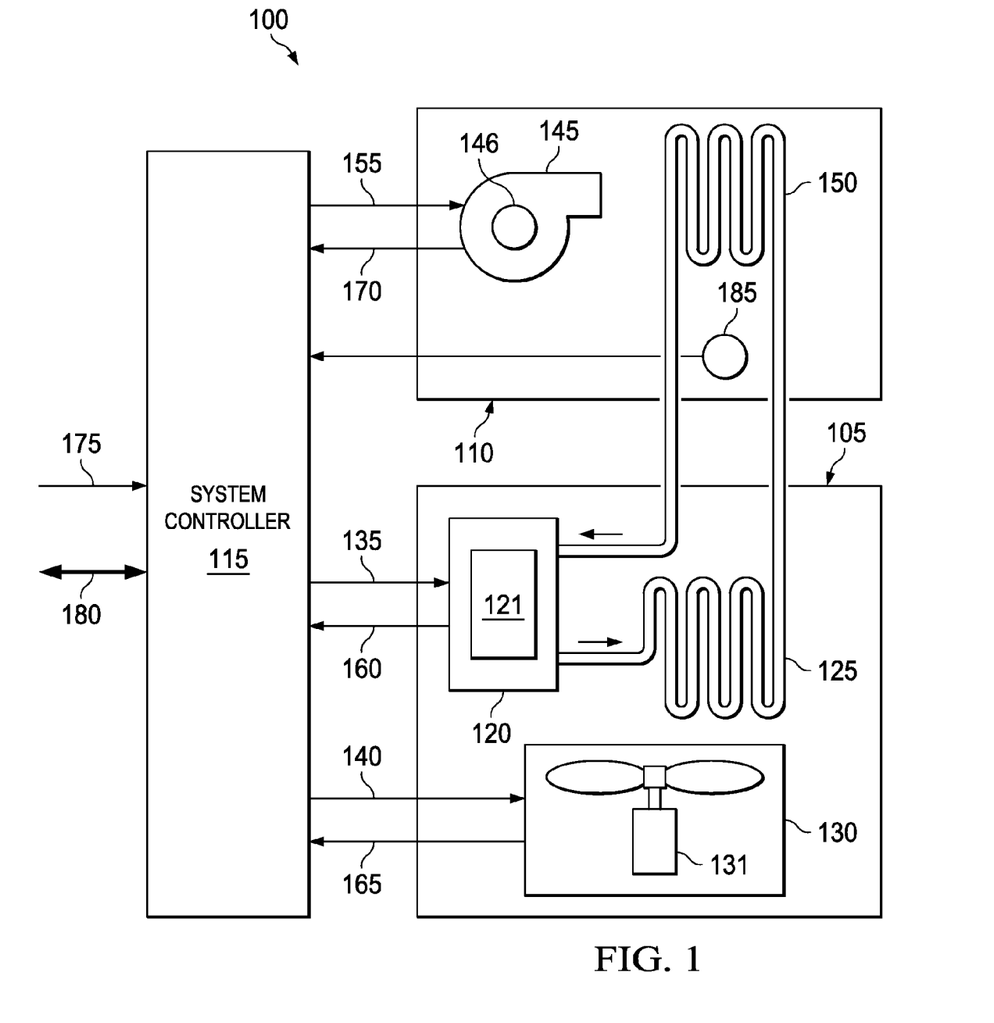
FIG. 1 illustrates an HVAC system configured according to one embodiment of the disclosure to control HVAC motors via a command signal bearing a digitally encoded operating level.

Turning initially to FIG. 1, illustrated is an HVAC system, generally designated 100 that advantageously overcomes many of the aforementioned deficiencies of conventional HVAC motor control. The system 100 may be, e.g., a residential or commercial HVAC system. The system 100 includes an outdoor unit 105, an indoor unit 110 and a system controller 115. The outdoor unit 105 may be, e.g., a rooftop unit or ground unit. The indoor unit 110 may be located in any desired location of a residential or commercial building. The system 100 may be a heat pump system or a traditional refrigeration system. The system 100 is illustrated without limitation as a traditional refrigeration system.

The outdoor unit 105 includes a compressor 120 having a compressor motor 121, an outdoor coil 125 and a fan assembly 130 having a fan motor 131. The compressor motor 121 operates in response to a compressor command signal 135 provided by the system controller 115. The compressor 120 operates to compress a refrigerant. The fan motor 131 operates in response to a fan command signal 140 from the system controller 115 to move air through the outdoor coil 125 to transfer heat from the compressed refrigerant to the outdoor ambient.

The indoor unit 110 includes a blower 145, including a blower motor 146, and an indoor coil 150. The refrigerant from the outdoor coil 125 expands through an expansion valve (not shown), thereby cooling, and then flows through the indoor coil 150. The blower motor 146 operates in response to a blower command signal 155 to move air over the indoor coil 150, thereby cooling the air. The refrigerant returns to the compressor 120 to be compressed again.

The compressor motor 121, the fan motor 131, and the blower motor 146 are members of a class of HVAC motors applicable to the various embodiments described herein and contemplated by the disclosure. The class of HVAC motors may additionally include any motor used in an HVAC system, including without limitation those motors used for the movement of air in the compression of refrigerant. Each motor in the class of HVAC motors includes a motor controller, as described further below, that is configured to receive a digital command signal encoded with an operating level of the motor, such as a motor speed (RPM) or a torque (foot-pounds or Newton-meters).

The system controller 115 controls the operation of the various components of the system 100 in response to a service demand 175. The service demand 175 may be provided by any conventional or unconventional source or method. In an illustrative embodiment, the service demand 175 is provided by a thermostat or similar unit located within an interior space conditioned by the indoor unit 110. In such an embodiment the system controller 115 may operate in a passive manner with respect to determining when cooling (or heating in some heat pump applications) of the interior space is needed. In another illustrative embodiment, the service demand 175 is a temperature signal provided by a sensor within the conditioned interior space, and the system controller 115 determines when the system 100 operates to cool the conditioned space. In such an embodiment, the system controller 115 operates in an active manner with respect to determining the need to cool (or heat) the conditioned space.

The system controller 115 may also be coupled to a network 180. The network 180 provides a signal pathway for remote configuration, monitoring and operation of the system 100. In some cases the system 100 may receive a service demand via the network 180. In some embodiments the system controller 115 reports the temperature of the conditioned space or the operating status of various components of the system 100 to an interrogating entity, such as a centralized operation facility, an installer or a manufacturer. In some cases, the network 180 is used to configure various aspects of the system 100, either prior to or after installation in a service location.

The compressor 120, the fan assembly 130, and the blower 145 are each illustrated returning optional respective feedback signals 160, 165, 170 to the system controller 115. The feedback signals 160, 165, 170 provide a representation of the actual speed or torque produced by the associated motor. The operation of the feedback signals 160, 165, 170 is described further below.

While the system 100 is illustrated providing digital control of each of the compressor motor 121, the fan motor 131, and the blower motor 146, in other embodiments fewer HVAC motors may be so controlled. Some benefits provided by various embodiments herein may be realized when, e.g., only the compressor motor 121 or only the blower motor 146 are controlled via a digitally encoded operating level. Similarly, in some embodiments two HVAC motors may be controlled digitally, while other HVAC motors are controlled via conventional methods. Such embodiments include cases in which a system design calls for one or more HVAC motors to be controlled in simple on-off fashion, e.g., no frequency conversions being needed, while variable speed of other HVAC motors is desired.

Figure 2:
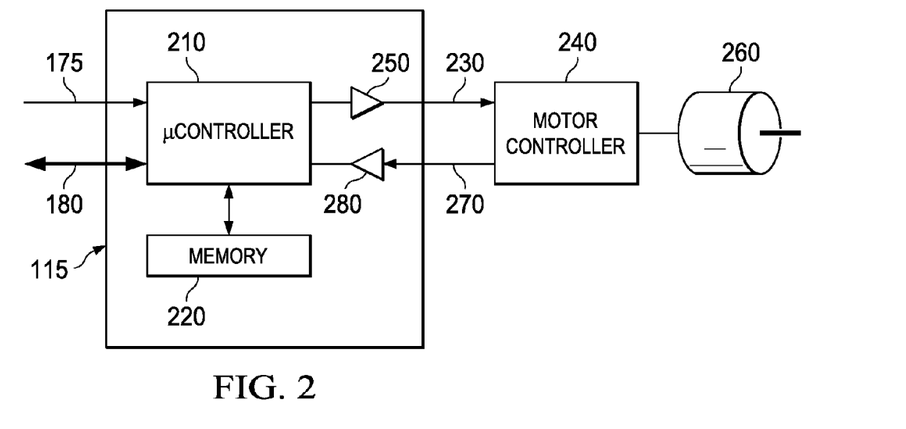
FIG. 2 illustrates an HVAC system controller configured according to one embodiment of the disclosure.

FIG. 2 illustrates an embodiment of the disclosure of the system controller 115. The system controller 115 is illustrated without limitation as including a microcontroller 210 and a memory 220. The microcontroller 210 may be any conventional or future developed microcontroller, microprocessor or state machine, e.g. Similarly, the memory 220 may be any conventional or future developed storage medium configurable to store program instructions executable by the microcontroller 210 and to provide the program instructions to the microcontroller 210 when commanded to do so. The memory 220 may include any of, e.g., volatile memory, nonvolatile memory, flash memory, random-access memory (RAM), read-only memory (ROM), programmable ROM (PROM), tape storage, disk storage, or optical storage.

The microcontroller 210 may control various functions of the HVAC system 100 in accordance with instructions stored by the memory 220. In particular, the microcontroller 210 provides a command signal 230 bearing a digitally encoded operating level to a motor controller 240. The command signal 230 is representative of the compressor command signal 135, the fan command signal 140, and the blower command signal 155, but may control any motor used in an HVAC system application. The command signal 230 may be buffered by a signal driver 250. The signal driver 250 may be implemented by components separate and distinct from the microcontroller 210, or may be wholly contained thereby.

The motor controller 240 is representative of a motor controller used to control any motor used in an HVAC system application. The motor controller 240 may include such electronics as are necessary to convert the received command signal 230 to a voltage and current necessary to operate an associated HVAC motor 260. The HVAC motor is generally representative of the compressor motor 121, the fan motor 131 and the blower motor 146. The particulars of such conversion are beyond the scope of this disclosure, but generally include, e.g., a state machine or microcontroller to decode the operating level from the command signal 230, and associated electronic devices such as power transistors to drive the HVAC motor 260 windings.

In various embodiments the motor controller 240 returns a feedback signal 270 to the system controller 115. The feedback signal 270 is received by a receiver 280. The receiver 280 may be implemented by components separate and distinct from the microcontroller 210, or may be wholly contained thereby. The feedback signal 270 is configured to provide an electrical signal representative of an actual output of the HVAC motor 260. The feedback signal 270 may use any desired analog or digital signal format. In some embodiments, the feedback signal 270 is digitally encoded using a same encoding scheme as the command signal 230. However, embodiments in which the encoding schemes are different are within the scope of the disclosure.

Figure 3:
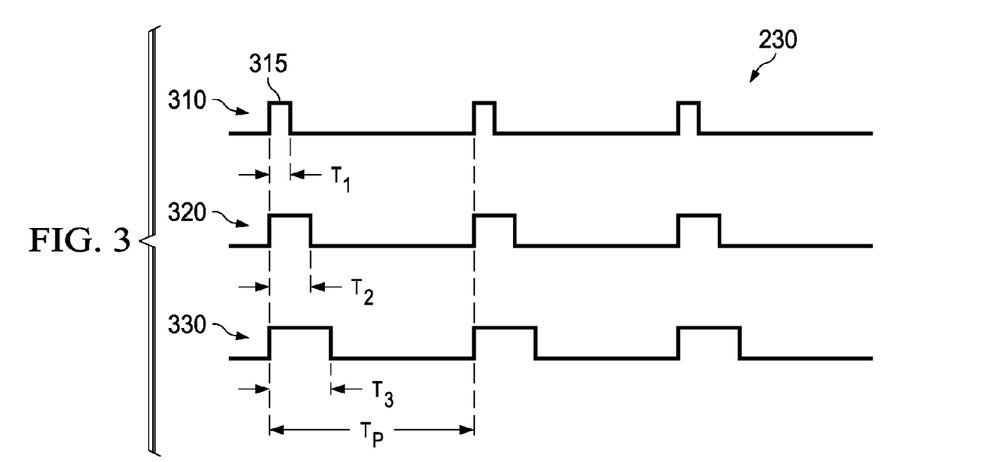
FIGS. 3 and 4 illustrate pulse-width modulation and pulse-frequency modulation, respectively, of a digitally encoded operating level.

FIG. 3 illustrates embodiments of the command signal 230 digitally encoded with an HVAC motor operating level. In the embodiments of FIG. 3, the encoding scheme is illustrated without limitation as pulse width modulation (PWM). In this scheme, a fraction of a maximum rated output of an HVAC motor may be encoded in the duty cycle of the digital command signal 230. For example, a waveform 310 has a period $T_P$. A pulse 315 has a width $T_1$ that is about 10% of $T_P$. The ratio of $T_1$ to $T_P$ is referred to as the duty cycle of the waveform 310. A digital command signal having the form of the waveform 310 may encode an output by the HVAC motor 260 of about 10% of a maximum rated output. Similarly, a waveform 320 has a duty cycle of about 20%, and a waveform 330 has a duty cycle of about 30%. The waveforms 320, 330 may thus encode an output of the HVAC motor 260 of about 20% and about 30%, respectively, of a maximum rated output. The extension to greater fractions of maximum rated output is within the capability of one of ordinary skill in the pertinent art.

Figure 4:
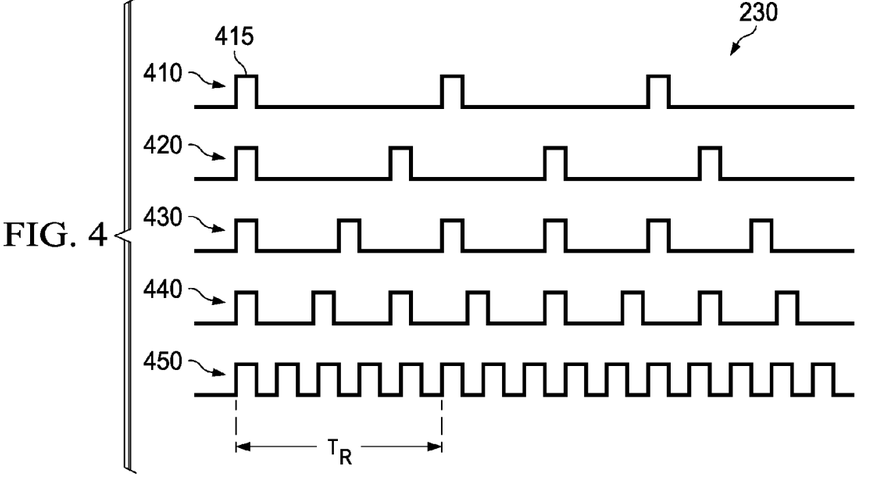

FIG. 4 illustrates an alternate embodiment of the command signal 230. In the embodiments of FIG. 4 the encoding scheme is illustrated without limitation as pulse frequency modulation (PFM). In this scheme, a fraction of a maximum rated output of an HVAC motor may be encoded in the number of pulses within a reference period $T_R$. For example, a waveform 410 has a single pulse 415 within the period $T_R$. The waveform 410 may represent a reference pulse rate that is interpreted by the HVAC motor controller as encoding 0% of a rated maximum output of the HVAC motor 260. A waveform 420 has a greater number of pulses in the reference period $T_R$, and therefore a greater frequency. Thus, the waveform 420 may encode a nonzero percentage of the maximum rated output of the HVAC motor 260, e.g. about 10%. Waveforms 430, 440 have progressively greater pulse frequencies. These waveforms may therefore encode progressively greater percentages of a maximum rated output of the HVAC motor 260. A waveform 450 has a 50% duty cycle, which in some embodiments may encode 100% of the maximum rated output of the HVAC motor. In some embodiments encoding 100% of the maximum rated output of the HVAC motor 260 with a 50% duty cycle may ensure that the command signal 230 is robust to electrical noise that may enter the signal line over a long signal path.

As described previously, the motor controller 240 may provide the feedback signal 270, representative of, e.g., the feedback signals 160, 165 170. Focusing without limitation on the feedback signal 170 for convenience, the feedback signal 170 may provide an electrical signal representative of an actual level of operation of the blower motor 146. In some cases, the actual level of operation may not be the same as a requested level of operation. For example, a requested level of operation may be a torque. In some cases the load on the blower 145 may vary under different operating conditions. For instance, the load on the blower 145 may vary depending on the configuration of air ducts associated therewith. The configuration may in turn vary depending on setting of dampers within the air ducts.

A variation of the load on the blower motor 146 may result in a different rate of airflow produced by the blower 145 under the different loads. Such variation may be undesirable in some cases. When the feedback signal 170 indicates an actual RPM of the blower motor 146 is lower than a desired RPM, the system controller 115 may respond by increasing the level of operation of the blower motor 146 commanded via the blower command signal 155.

Figure 5:
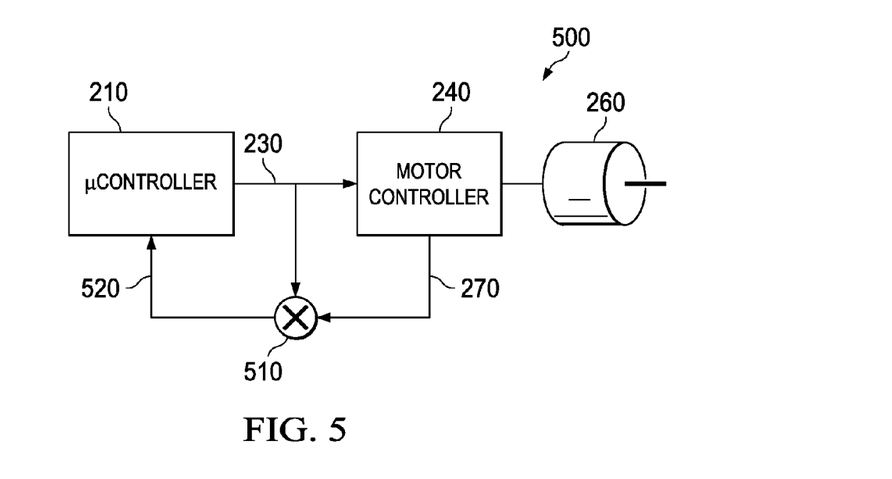
FIG. 5 illustrates an embodiment of the disclosure of control of an HVAC motor employing closed-loop feedback.

FIG. 5 illustrates an embodiment of a feedback loop 500 that may be employed by the system controller 115 to maintain a desired actual output of the HVAC motor 260. The feedback control loop 500 is representative of various embodiments that may be implemented via program instructions executed by the microcontroller 210, or by components distinct therefrom. The system controller 115 may employ an active feedback loop to ensure the actual level of operation of the HVAC motor 260 is within an acceptable tolerance band around the requested level of operation. When the feedback signal 270 is responsive to a speed of the HVAC motor 260, the system controller 115 may be configured to operate the HVAC motor 260 at a constant speed.

The feedback loop 500 includes a summing node 510 that receives the control signal 230 and the feedback signal 270. The node 510 computes an error signal 520 that is received by the microcontroller 210. The microcontroller 210 is configured in various embodiments to command a level of output by the HVAC motor 260, via the command signal 230, that minimizes the value of the error signal 520. The feedback signal 270 may be an analog or a digital signal. When the feedback signal 270 is analog, the summing node 510 may include circuitry to convert the control signal 230 to an analog value, and then determine an analog difference. When the feedback signal 270 is digitally encoded, the summing node 510 may perform a digital calculation of the difference between the control signal 230 and the feedback signal 270. In some embodiments the microcontroller 210 includes an integrated analog-to-digital converter (ADC) that converts the feedback signal 270 in analog form to a digital value to perform a digital difference calculation.

In some embodiments, the system controller 115 may report to a remote entity the actual level of operation of the HVAC motor 260 as determined from the feedback signal 270. As used herein, a remote entity is a person, corporate entity, or computer located remotely to the HVAC system 100. The remote entity may wish to monitor an actual level of operation of the HVAC motor 260, e.g., to monitor energy usage, or for maintenance purposes. The system controller 115 may form a suitably formatted message including the actual level of operation of the HVAC motor 260 and transmit the message to the remote entity via the network 180. (See FIG. 2.)

In some embodiments, the system controller 115 may receive from the remote entity via the network 180 an appropriately configured message instructing the system controller 115 to take an action with respect to an HVAC motor 260. For example, the message may instruct the system controller 115 to reduce a level of operation of the compressor motor 121 to limit energy consumed thereby.

Digital control of HVAC motors as set forth herein provides a means for sophisticated control of the HVAC system 100 for improved system performance and reduced energy consumption. In one embodiment, the HVAC system 100 is configured to control air flow from the blower 145 to maintain a temperature of the coil 150. For example, in some embodiments the system 100 is operated to provide dehumidification of the air passing over the coil 150. In such a case it may be desirable to operate the system such that the temperature of the coil 150 does not exceed a maximum value above which the effectiveness of the dehumidification is reduced, or fall below the freezing temperature of water.

In such embodiments, the rate of air flow over the coil 150 may be limited to ensure that the temperature of the coil 150 does not exceed the maximum effective value. An air flow limit may be empirically determined and provided to the system controller 115 via configuration parameters stored, e.g., in a nonvolatile memory. Such parameters may take into account, e.g., indoor humidity, indoor air temperature, outdoor air temperature, and cooling demand.

Referring to FIG. 1, in some embodiments, the system 100 may include a temperature sensor 185 configured to report a temperature of the coil 150 to the system controller 115. The system controller 115 may then be configured to operate the compressor motor 121, fan motor 131 and blower motor 146 in a manner that maintains the temperature of the coil 150 at or near an optimum dehumidification temperature. For example, the system controller 115 may transmit an operating level to the blower motor 146 that results in a low rate of air flow over the coil 150 while transmitting operating levels to the compressor motor 121 and the fan motor 131 that result in a high rate of heat removal from the refrigerant. Thus, the coil 150 will be effectively chilled, resulting in rapid dehumidification of the air passing thereover.

The system controller 115 is also configurable to provide sophisticated control of the HVAC system 100 to improve energy efficiency of the system relative to conventional control. Table I presents various control settings of an HVAC system used in some conventional systems.

TABLE I

| Cooling Load | Dehumidify | Fan Motor | Compressor Motor | Blower Motor |
|---|---|---|---|---|
| High (Y3) | — | High | High | High |
| Med (Y2) | No | High | High | High |
| Med (Y2) | Yes | High | High | High |
| Low (Y1) | No | Low | Low | Low |
| Low (Y1) | Yes | Low | High | Low |

The control settings of Table I may be implemented directly using digitally encoded operating levels of the compressor motor 121, the fan motor 131 and the blower motor 146 consistent with the values of Table I. However, unlike conventional HVAC systems, the system controller 115 may be configured to provide digitally encoded operating levels to the motors 121, 131, 146 that are dynamically controlled to result in a desired performance characteristic of the HVAC system 100. For example, the system controller 115 may be configured to determine a total energy consumption of the HVAC system 100 from the feedback signals 160, 165, 170. The system controller 115 may then dynamically seek a minimum energy consumption of the system 100 for the operating conditions, e.g., temperature and humidity, currently existing.

In some embodiments, an instantaneous energy unit cost may be reported to the system controller 115, via the network 180. The microcontroller 115 may in turn be configured to operate the HVAC system 100 in a manner that results in a minimum cost of operation. Thus, the digitally encoded operating levels provided to the motors 121, 131, 146 may vary depending on the energy cost at different times of day, even when ambient conditions are otherwise identical. Control of the motors 121, 131, 146 using the digitally encoded operating levels provided by the various embodiments described herein and within the scope of the disclosure significantly simplifies such active control of the HVAC system 100 relative to conventional motor control.

Figure 6:
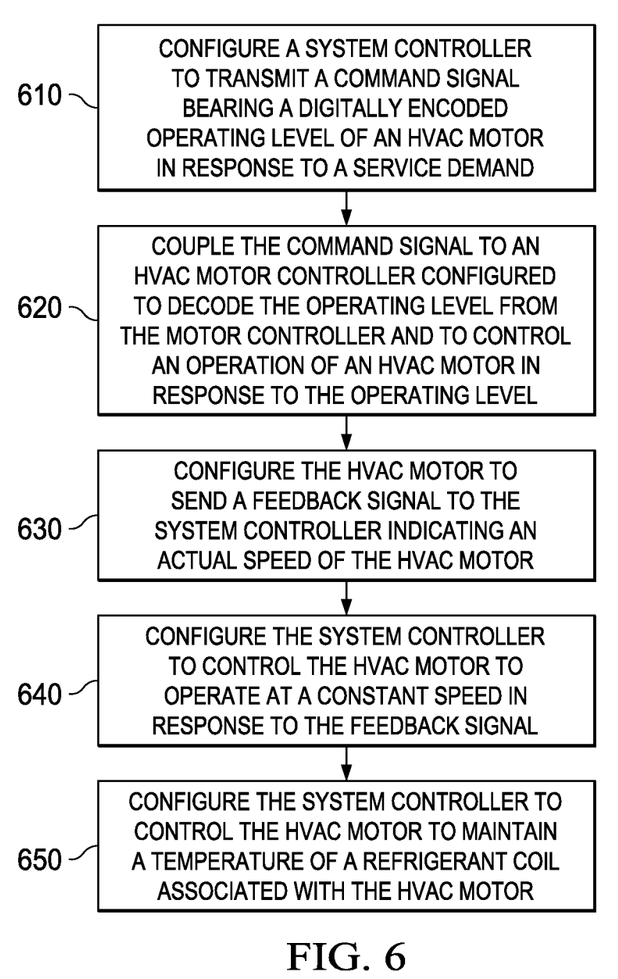
FIG. 6 illustrates a method of manufacturing an HVAC system according to an embodiment of the disclosure.

FIG. 6 illustrates a method generally denoted 600 of manufacturing an HVAC system. The method 600 is described without limitation with reference to the HVAC system 100 and components thereof. In an initial step 610, an HVAC system controller, e.g. the system controller 115, is configured to transmit a command signal bearing a digitally encoded operating level of an HVAC motor in response to a service demand. The operating level may be encoded with, e.g., PWM or PFM encoding. In a step 620, the command signal is coupled to an HVAC motor controller, e.g., the motor controller 240. The motor controller is configured to decode the operating level there from, and to control an operation of an HVAC motor in response to the operating level.

In an optional step 630, the method 600 includes configuring the HVAC motor controller to send a feedback signal to the system controller indicating an actual speed of the HVAC motor. In another optional step 640, the system controller is configured to control the HVAC motor to operate at a constant speed in response to the feedback signal. In yet another optional step 650, the system controller is configured to control the HVAC motor to maintain a temperature of a refrigerant coil associated with the HVAC motor.

Figure 7:
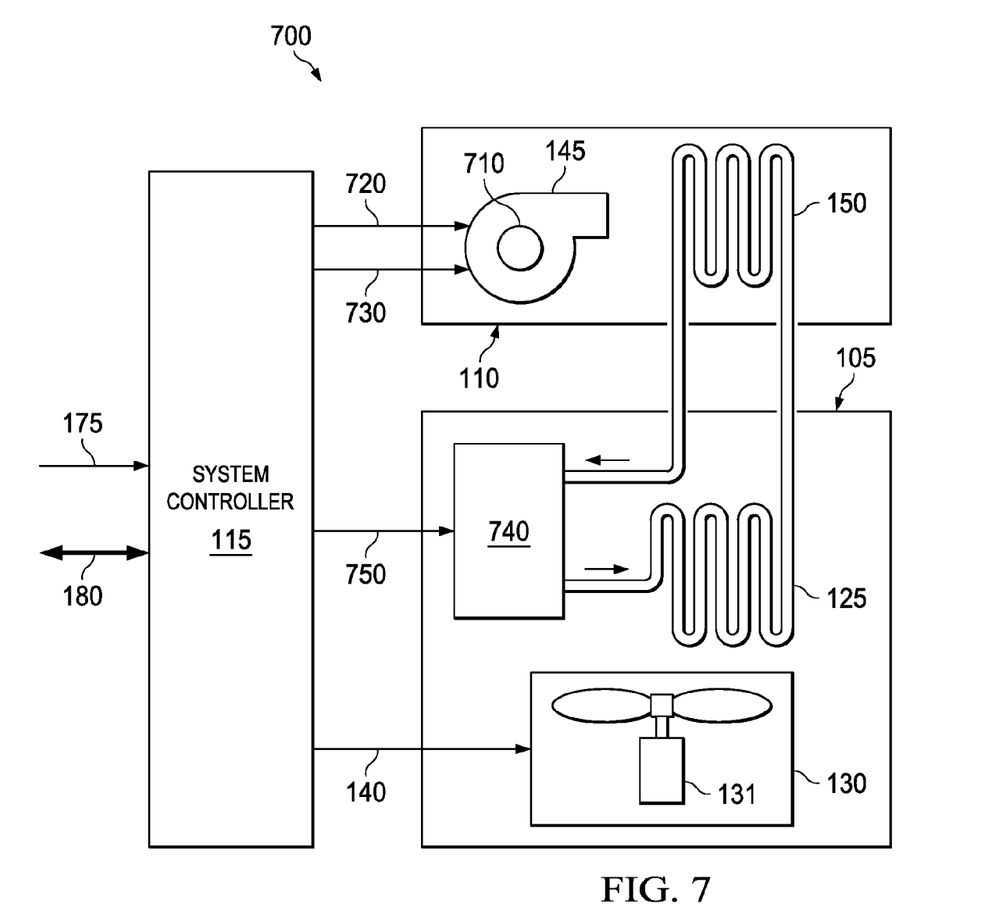
FIG. 7 illustrates an HVAC system configured according to one embodiment of the disclosure configured to operate a multispeed HVAC motor and a variable capacity compressor.

Turning to FIG. 7, illustrated is an embodiment of an HVAC system 700 in which a multispeed HVAC motor 710 drives an HVAC component, the blower 145 in the illustrated embodiment. As used herein and in the claims, a multispeed HVAC motor is a motor configured to provide a number of loads in response to control signals 720, 730 supplied thereto. More specifically, the number of loads may be a number of motor speeds, or a number of torque levels, e.g. Thus, the HVAC motor 710 may configured to provide a first, lower torque, and a second higher torque. The system 700 further includes a variable capacity compressor 740 that, in one embodiment, is configured to operate in response to a control signal 750 provided by the system controller 115 responsive to the control algorithm. The compressor 740 may further be configured to operate with two compression capacities.

Figure 8:
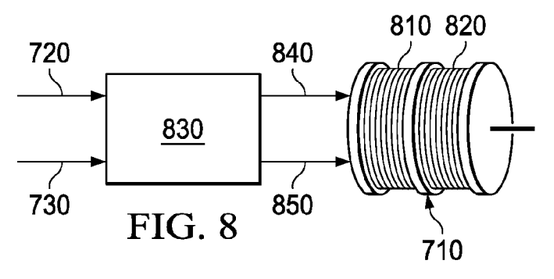
FIG. 8 illustrates a multispeed HVAC motor in relevant detail.

Referring to FIG. 8, the HVAC motor 710 has a first winding 810 configured to produce a first number of magnetic poles when energized, and a second winding 820 configured to produce a second greater number of magnetic poles. The HVAC motor 710 produces the lower torque output when the first winding 810 is energized, and the higher torque when the second winding 820 is energized.

A contactor board 830 receives the control signals 720, 730, and provides a first winding power 840 and a second winding power 850 in response thereto. The contactor board 830 may include, e.g., one or more relays that are actuated by the control signals 720, 730 to provide line power, e.g. 3-phase 208 VAC, to the windings 810, 820. In some embodiments the contactor board 830 includes a relay configured to ensure that the first winding 810 and the second winding 820 are not simultaneously energized.

In typical operation of the system 700, the system controller 115 asserts the control signals 720, 730 in response to a control algorithm that responds to the demand 175. The demand 175 may in some cases call for a high demand, and in other cases for a low demand. The low demand may be used in some cases to reduce a total energy consumption of the system 700.

In some embodiments, the first number of poles of the first winding 810 is four, and the second number of poles of the second winding 820 is six. Neglecting nonlinearities, the air flow from the blower 145 is expected to be about one-third less (~1:1.5 ratio) when the HVAC motor 710 is operated using the second winding 820 than when operated using the first winding 810. The torque produced by the HVAC motor 710 is expected to be about 50% greater when operated using the second winding 820 than when operated using the first winding 810. The higher air flow associated with the lower torque is referred to herein and in the claims as a first blower load, while the lower air flow associated with the higher torque is referred to herein and in the claims as a second blower load.

Figure 9:
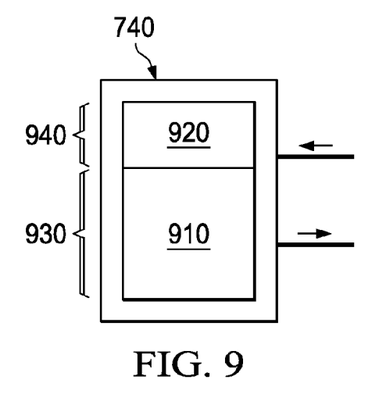
FIG. 9 illustrates a variable capacity compressor in relevant detail.

FIG. 9 illustrates the compressor 740 of FIG. 7 in further detail. The compressor 740 includes two compression portions. A first compression portion 910 provides a greater compression capacity and the second compression portion 920 provides a lesser compression capacity. In a nonlimiting embodiment, the compressor 740 is a scroll compressor. In such an embodiment the first compression portion 910 may have a first compression scroll, and the second compression portion 920 may have a second compression scroll, with each scroll being driven by a common shaft of a compressor motor (not shown). The flow of refrigerant may be controlled, e.g., by a solenoid valve, to at least one of the compression portions 910, 920.

The compressor 740 may operate a full capacity when refrigerant is allowed to flow to both portions 910, 920. However, the compressor 740 may operate at a partial capacity when the flow of refrigerant is cut off from one of the portions 910, 920. Thus, e.g., when only the first compressor portion 910 is configured to compress the refrigerant, the compressor 740 may operate with a first compression capacity. When both the portions 910, 920 are configured to compress the refrigerant the compressor 740 may operate with a second, greater compressor capacity. The relative capacities of the first and second compressor portions 910, 920 may be determined, e.g., by varying a length 930 and a length 940 associated respectively with the compressor portions 910, 920.

In various embodiments the first and second compression capacities are matched to the first and second blower loads provided by the blower 145. Thus, continuing with the previous example in which the HVAC motor 710 provides a second blower load 50% greater than a blower load, the compressor 740 may be configured to have a second compression capacity about 50% greater than a first compression capacity. When the operation of the compressor 740 is thus matched to the first and second blower loads, the temperature of the coil 150 may advantageously be maintained at about a same operating temperature independent of whether the system 700 is operating at a high capacity or a low capacity. A constant operating temperature of the coil 150 is generally preferred to provide a consistent rate of water removal (dehumidification) from the air flowing over the coil 150.

While the previously described embodiment is described for the specific case that the HVAC motor 710 and the compressor 740 provide 50% greater capacity in a high-capacity configuration, embodiments of the disclosure may be practiced with any desired difference of capacity. In some cases, the ratio of the first to second blower load is different than the ratio of the first to second compressor capacity to result in a specific temperature of the coil 150 at low and high demand operation of the system 700.

Figure 10:
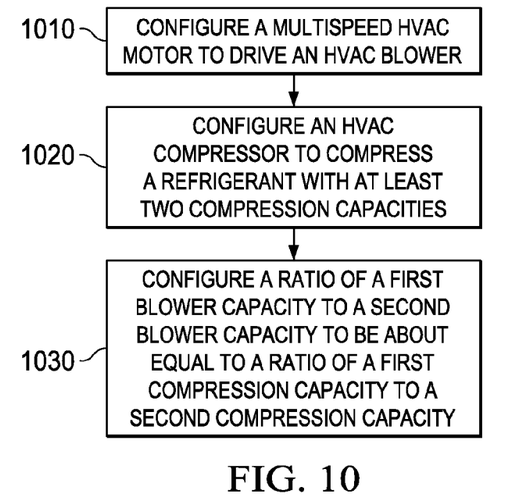
FIG. 10 illustrates a method of manufacturing an HVAC system according to an embodiment of the disclosure.

Turning now to FIG. 10, illustrated is a method generally designated 1000 of manufacturing an HVAC system. The method 1000 is described with nonlimiting reference to the system 700 and components thereof. In a first step 1010, a multispeed HVAC motor is configured to provide a number of blower capacities in response to control signals supplied by an HVAC system controller. The number of blower capacities is at least 2, and includes a lower blower capacity and a higher blower capacity. The multispeed HVAC motor has a first winding configured to produce a first number of magnetic poles when energized, and a second winding configured to produce a second number of magnetic poles when energized. In a step 1020, an HVAC compressor is configured to compress a refrigerant with at least two compression capacities. The number of compression capacities is equal to the number of blower capacities, and includes a lower compression capacity and a higher compression capacity. In an optional step 1030, the system 700 is configured such that a ratio of a first blower capacity to a second blower capacity is about equal to a ratio of a first compression capacity to a second compression capacity.

Those skilled in the art to which this application relates will appreciate that other and further additions, deletions, substitutions and modifications may be made to the described embodiments.

What is claimed is:
1. An HVAC system, comprising:
an HVAC motor;
a motor controller coupled to the HVAC motor and configured to:
 receive a first command signal of the HVAC motor and a second command signal of the HVAC motor;
 decode a first operating level of the HVAC motor from the received first command signal of the HVAC motor; and
 decode a second operating level of the HVAC motor from the received second command signal of the HVAC motor;
a system controller coupled to the motor controller and configured to:
 receive a first energy unit cost at a first time;
 determine a digitally encoded operating level of the HVAC motor based at least upon the first energy unit cost;
 modulate the first command signal with the digitally encoded operating level of the HVAC motor in response to a service demand;
 transmit the modulated first command signal to the motor controller;
 receive a second energy unit cost at a second time;
 update the digitally encoded operating level of the HVAC motor based at least upon the second energy unit cost;

modulate the second command signal with the updated digitally encoded operating level; and transmit the modulated second command signal to the motor controller;

a feedback loop coupled to the system controller and the motor controller, the feedback loop including a summing node that is configured to receive the first command signal from the system controller, the second command signal from the system controller, and a feedback signal representative of an actual level of operation of the HVAC motor; and the system controller is further configured to:
receive the feedback signal from the summing node;
determine a total energy consumption of the HVAC system based on the feedback signal;
based on the determined total energy consumption of the HVAC system, determine a new digitally encoded operating level of the HVAC motor to reduce an energy consumption of the HVAC system; and
modulate a third command signal with the new digitally encoded operating level.

2. The HVAC unit as recited in claim 1, wherein the first operating level is encoded on the first command signal of the HVAC motor with pulse-width modulation.

3. The HVAC unit as recited in claim 1, wherein the first operating level is encoded on the first command signal with pulse-frequency modulation.

4. The HVAC unit as recited in claim 1, wherein the HVAC motor is configured to send a feedback signal to the system controller indicating an actual speed of the HVAC motor.

5. The HVAC unit as recited in claim 4, wherein the first operating level is a torque, and the system controller is configured to control the HVAC motor to operate at a constant speed in response to the feedback signal.

6. The HVAC unit as recited in claim 1, wherein the HVAC motor drives a blower, and the system controller controls the HVAC motor in response to a signal reported by a sensor configured to determine a temperature of a refrigerant coil associated with the blower.

7. The HVAC unit as recited in claim 1, wherein a first ambient condition at the first time is substantially similar to a second ambient condition at the second time.

8. A method of manufacturing an HVAC system, comprising:
receiving, at a system controller, a first energy unit cost at a first time;
determining, at the system controller, a digitally encoded operating level of an HVAC motor based at least upon the first energy unit cost;
modulating, at the system controller, a first command signal with the digitally encoded operating level of the HVAC motor in response to a service demand;
transmitting, from the system controller to a motor controller, the first decoding, at the motor controller, a first operating level of the HVAC motor from the received first command signal;
controlling, at the motor controller, an operation of the HVAC motor in response to the decoded first operating level of the HVAC motor;
receiving, at the system controller, a second energy unit cost at a second time;
updating, at the system controller, the digitally encoded operating level of the HVAC motor based at least upon the second energy unit cost;
modulating, at the system controller, a second command signal with the updated digitally encoded operating level;
transmitting, from the system controller to the motor controller, the second command signal;
decoding, at the motor controller, a second operating level of the HVAC motor from the received second command signal;
controlling, at the motor controller, the operation of the HVAC motor in response to the decoded second operating level;
receiving, at a summing node in a feedback loop, the first command signal from the system controller, the second command signal from the system controller, and a feedback representative of an actual level of the HVAC motor;
receiving, at the system controller, the feedback from the summing node;
determining, at the system controller, a total energy consumption of the HVAC system based on the feedback;
based on the determined total energy consumption of the HVAC system, determining a new digitally encoded operating level of the HVAC motor to reduce an energy consumption of the HVAC system; and
modulating, at the system controller, a third command signal with the new digitally encoded operating level.

9. The method as recited in claim 8, wherein the first operating level is encoded on the first digital command signal with pulse-width modulation.

10. The method as recited in claim 8, wherein the first operating level is encoded on the first digital command signal with pulse-frequency modulation.

11. The method as recited in claim 8, further comprising configuring the motor controller to send a feedback signal to the system controller indicating an actual speed of the HVAC motor.

12. The method as recited in claim 11, further comprising configuring the system controller to control the HVAC motor to operate at a constant speed in response to the feedback signal.

13. The method as recited in claim 8, wherein the HVAC motor drives a blower, and further comprising configuring the system controller to control the HVAC motor to maintain a temperature of a refrigerant coil associated with the HVAC motor.

14. The method as recited in claim 8, wherein a first ambient condition at the first time is substantially similar to a second ambient condition at the second time.

* * * * *